United States Patent
Bedell et al.

(10) Patent No.: US 8,823,127 B2
(45) Date of Patent: Sep. 2, 2014

(54) MULTIJUNCTION PHOTOVOLTAIC CELL FABRICATION

(75) Inventors: Stephen W. Bedell, Yorktown Heights, NY (US); Norma Sosa Cortes, Yorktown Heights, NY (US); Keith E. Fogel, Yorktown Heights, NY (US); Devendra Sadana, Yorktown Heights, NY (US); Davood Shahrjerdi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/614,953

(22) Filed: Sep. 13, 2012

(65) Prior Publication Data

US 2013/0000708 A1    Jan. 3, 2013

Related U.S. Application Data

(62) Division of application No. 12/713,581, filed on Feb. 26, 2010.

(60) Provisional application No. 61/185,247, filed on Jun. 9, 2009.

(51) Int. Cl.
| | |
|---|---|
| H01L 31/06 | (2012.01) |
| H01L 29/04 | (2006.01) |
| H01L 29/10 | (2006.01) |
| H01L 31/00 | (2006.01) |
| H01L 29/80 | (2006.01) |
| H01L 31/112 | (2006.01) |

(52) U.S. Cl.
USPC .............................. 257/461; 257/53; 257/257

(58) Field of Classification Search
USPC ............. 257/22, 53, 257, 290, 428, 431, 436, 257/440, 450, 461, 463–466
See application file for complete search history.

(56) References Cited

U.S. PATENT DOCUMENTS

| | | |
|---|---|---|
| 2,274,112 A | 2/1942 | Wesley et al. |
| 4,133,724 A | 1/1979 | Hartnagel et al. |

(Continued)

FOREIGN PATENT DOCUMENTS

| | | |
|---|---|---|
| JP | 2009141135 | 6/2009 |
| JP | 2009532918 A | 9/2009 |

(Continued)

OTHER PUBLICATIONS

K. Bock et al., New Manufacturing Concepts for Ultra-Thin Silicon and Gallium Arsenide Substrates, International Conf. On Compound Semiconductor Mfg., 2003, GaAsMANTECH Inc.

(Continued)

*Primary Examiner* — Calvin Choi
(74) *Attorney, Agent, or Firm* — Cantor Colburn LLP; Vazken Alexanian (57) ABSTRACT

A multijunction photovoltaic (PV) cell includes a bottom flexible substrate and a bottom metal layer located on the bottom flexible substrate. The multijunction photovoltaic cell also includes a semiconductor layer located on the bottom metal layer and a stack having a plurality of junctions located on the semiconductor layer, each of the plurality of junctions having a respective bandgap. The pluralities of junctions are ordered from the junction having the smallest bandgap being located on the substrate to the junction having the largest bandgap being located on top of the stack.

5 Claims, 9 Drawing Sheets

(56) References Cited

U.S. PATENT DOCUMENTS

| | | | |
|---|---|---|---|
| 4,244,348 A | 1/1981 | Wilkes | |
| 4,331,703 A | 5/1982 | Lindmayer | |
| 4,590,095 A | 5/1986 | Park | |
| 4,710,589 A | 12/1987 | Meyers et al. | |
| 4,805,003 A | 2/1989 | Holm et al. | |
| 4,855,012 A | 8/1989 | Sumi | |
| 4,997,793 A | 3/1991 | McClurg | |
| 5,000,816 A | 3/1991 | Seki et al. | |
| 5,272,114 A | 12/1993 | van Berkum et al. | |
| 5,350,459 A | 9/1994 | Suzuki et al. | |
| 5,668,060 A | 9/1997 | Sato et al. | |
| 5,854,123 A | 12/1998 | Sato et al. | |
| 5,882,987 A | 3/1999 | Srikrishnan | |
| 5,902,505 A * | 5/1999 | Finley | 219/547 |
| 6,013,563 A | 1/2000 | Henley et al. | |
| 6,033,974 A | 3/2000 | Henley et al. | |
| 6,040,520 A | 3/2000 | Morooka et al. | |
| 6,238,539 B1 | 5/2001 | Joyce et al. | |
| 6,452,091 B1 | 9/2002 | Nakagawa et al. | |
| 6,500,732 B1 | 12/2002 | Henley et al. | |
| 6,517,632 B2 | 2/2003 | Minami et al. | |
| 6,612,590 B2 | 9/2003 | Coomer et al. | |
| 6,682,990 B1 | 1/2004 | Iwane et al. | |
| 6,794,276 B2 | 9/2004 | Letertre et al. | |
| 6,802,026 B1 | 10/2004 | Patterson et al. | |
| 6,802,926 B2 | 10/2004 | Mizutani et al. | |
| 6,808,952 B1 | 10/2004 | Sniegowski et al. | |
| 6,809,009 B2 | 10/2004 | Aspar et al. | |
| 6,846,698 B2 | 1/2005 | O'Keefe et al. | |
| 6,869,266 B2 | 3/2005 | Coomer et al. | |
| 6,887,650 B2 | 5/2005 | Shimoda et al. | |
| 6,951,819 B2 * | 10/2005 | Iles et al. | 438/705 |
| 6,989,575 B2 | 1/2006 | Gates et al. | |
| 7,018,909 B2 | 3/2006 | Ghyselen et al. | |
| 7,022,585 B2 | 4/2006 | Solanki et al. | |
| 7,037,806 B1 | 5/2006 | Atanackovic | |
| 7,056,808 B2 | 6/2006 | Henley et al. | |
| 7,122,445 B2 | 10/2006 | Takayama et al. | |
| 7,232,737 B2 | 6/2007 | Daval | |
| 7,341,927 B2 | 3/2008 | Atwater, Jr. et al. | |
| 7,387,946 B2 | 6/2008 | Dao | |
| 7,427,554 B2 | 9/2008 | Henley et al. | |
| 7,436,066 B2 | 10/2008 | Sonobe et al. | |
| 7,487,684 B2 | 2/2009 | Gupta et al. | |
| 7,488,890 B2 | 2/2009 | Takamoto et al. | |
| 8,088,669 B2 | 1/2012 | Yamazaki | |
| 8,124,499 B2 | 2/2012 | Henley et al. | |
| 2001/0055854 A1 | 12/2001 | Nishida et al. | |
| 2002/0094260 A1 | 7/2002 | Coomer et al. | |
| 2002/0195137 A1 | 12/2002 | King et al. | |
| 2003/0198547 A1 | 10/2003 | Coomer et al. | |
| 2004/0173790 A1 | 9/2004 | Yeo et al. | |
| 2004/0235268 A1 | 11/2004 | Letertre et al. | |
| 2004/0261837 A1 | 12/2004 | Friedman et al. | |
| 2005/0072461 A1 | 4/2005 | Kuchinski et al. | |
| 2005/0268963 A1 | 12/2005 | Jordan et al. | |
| 2006/0076559 A1 | 4/2006 | Faure et al. | |
| 2006/0112986 A1 | 6/2006 | Atwater, Jr. et al. | |
| 2006/0144435 A1 | 7/2006 | Wanlass | |
| 2006/0162768 A1 | 7/2006 | Wanlass et al. | |
| 2006/0207648 A1 | 9/2006 | Shima et al. | |
| 2006/0260932 A1 | 11/2006 | Ravkin et al. | |
| 2007/0012353 A1 | 1/2007 | Fischer et al. | |
| 2007/0023777 A1 | 2/2007 | Sonobe et al. | |
| 2007/0024914 A1 | 2/2007 | Chung et al. | |
| 2007/0029043 A1 | 2/2007 | Henley | |
| 2007/0037323 A1 | 2/2007 | Henley et al. | |
| 2007/0039395 A1 | 2/2007 | Gupta et al. | |
| 2007/0141803 A1 | 6/2007 | Boussagol et al. | |
| 2007/0166974 A1 | 7/2007 | Uchino et al. | |
| 2007/0235074 A1 | 10/2007 | Henley et al. | |
| 2007/0249140 A1 | 10/2007 | Dross et al. | |
| 2007/0269960 A1 | 11/2007 | Letertre et al. | |
| 2007/0277873 A1 | 12/2007 | Cornfeld et al. | |
| 2007/0295973 A1 * | 12/2007 | Jinbo et al. | 257/88 |
| 2008/0012121 A1 | 1/2008 | Hara et al. | |
| 2008/0110489 A1 | 5/2008 | Sepehry-Fard | |
| 2008/0132047 A1 | 6/2008 | Dunne et al. | |
| 2008/0210563 A1 | 9/2008 | Zhang et al. | |
| 2008/0241986 A1 | 10/2008 | Rohatgi et al. | |
| 2008/0245409 A1 | 10/2008 | Varghese et al. | |
| 2008/0268615 A1 | 10/2008 | Allibert et al. | |
| 2008/0268622 A1 | 10/2008 | Van Gestel | |
| 2008/0280420 A1 | 11/2008 | Yamazaki | |
| 2009/0038678 A1 | 2/2009 | Pan et al. | |
| 2009/0117679 A1 | 5/2009 | Fritzemeier | |
| 2009/0211623 A1 | 8/2009 | Meier et al. | |
| 2009/0277314 A1 | 11/2009 | Henley | |
| 2009/0280635 A1 | 11/2009 | Mathew et al. | |
| 2010/0015750 A1 | 1/2010 | Shen et al. | |
| 2010/0087045 A1 | 4/2010 | Shimomura et al. | |
| 2010/0112195 A1 | 5/2010 | Kodas et al. | |
| 2010/0307572 A1 | 12/2010 | Bedell et al. | |
| 2010/0307591 A1 | 12/2010 | Bedell et al. | |
| 2010/0310775 A1 | 12/2010 | Bedell et al. | |
| 2011/0048516 A1 | 3/2011 | Bedell et al. | |
| 2011/0048517 A1 | 3/2011 | Bedell et al. | |

FOREIGN PATENT DOCUMENTS

| | | |
|---|---|---|
| KR | 2009025257 A | 3/2009 |
| WO | WO2009061353 A2 | 5/2009 |
| WO | WO2009098109 A1 | 8/2009 |
| WO | WO2009151979 A2 | 12/2009 |
| WO | WO2010072675 A2 | 7/2010 |

OTHER PUBLICATIONS

M. Brede et al., Brittle crack propagation in silicon single crystals, Journal of Applied Physics, 1991, pp. 758-771, 70 (2), American Institute of Physics.

F. Dross et al., Stress-induced large-area lift-off of crystalline Si films, Applied Phsyics, 2007, pp. 149-152, A 89.

V.P. Ganesh et al., Overview and Emerging Challenges in Mechanical Dicing of Silicon Wafers, Electronics Packaging Technology Conference, Dec. 2006, pp. 15-21, EPTC.

J.F. Geisz et al., High-efficiency GaInP/GaAs/InGaAs triple-junction solar cells grown inverted with a metamorphic bottom junction, Applied Physics, 2007, 023502, 91, American Institute of Physics.

T. Hjort et al., Gallium arsenide as a mechanical material, J. Micromech. Microeng., 1994, pp. 1-13, 4.

M. Konagai et al., High Efficiency GaAs thin film solar cells by peeled firm technology, Journal of Crystal Growth, 1978, pp. 277-280, 45, North-Holland Publishing Company.

D. Law, et al., "Lightweight, Flexible, High-Efficiency III-V Multijunction Cells"; Photovoltaic Energy Conversion, Conference Record of the 2006 IEEE, 4th World Conference May 2006, pp. 1879-1882.

M.R. Page et al., Well Passivated a-Si:H Back Contacts for Double-Heterojunction Silicon Solar Cells, IEEE 4th World Conf on Photovoltaic Energy Conv, May 2006, pp. 1485-1488, vol. 2, IEEE.

International Search Report and Written Opinion, Mailed Jun. 24, 2011; International Application No. PCT/EP2011/051545; International Filing Date: Feb. 3, 2011; 14 pages.

International Search Report and Written Opinion of the International Searching Authority, Mailed Oct. 27, 2011; International Application No. PCT/US2011/024949; International Filing Date: Feb. 16, 2011; 8 pages.

International Search Report. Mailed Jul. 9, 2010. International Business Machines Corporation. PCT/US2010/034161, International filed May 10, 2012; 8 pages.

International Search Report and Written Opinion mailed Aug. 2, 2010 for International Application No. PCT/US2010/037029 International Filing date Jun. 2, 2010; 7 pages.

C. Scheck et al., Evolution of interface properites of electrodeposited Ni/GaAs(001) contacts upon annealing, Journal of Applied Physics, 2004, pp. 6549-6551, vol. 95, No. 11, American Institute of Physics.

J.J. Schermer et al., Epitaxial Lift-Off for large area thin film III/V devices, Phys. Stat. Sol., 2005, pp. 501-508, (a) 202, No. 4.

(56) References Cited

OTHER PUBLICATIONS

M.V. Sullivan et al., Electroless Nickel Plating for Making Ohmic Contacts to Silicon, Journal of the Electrochemical Society, 1957, pp. 226-230, vol. 104, No. 4.

Y. Tsunomura et al., 22%-Efficiency HIT Solar cell, Technical Digest of the International PVSEC-17, 2007, pp. 387-390, Fukuoka.

M. Wanlass et al., Monolithic, Ultra-Thin, GaInP/GaAs/GaInAs Tandem Solar Cells, IEEE 4th World Conference on Photovoltaic Energy Conv, May 2006, pp. 729-732, vol. 2, IEEE.

K. Wasmer et al., Cleavage Fracture of Brittle Semiconductors from the Nanometer to the Centimeter Scale, Advanced Engineering Materials, 2005, pp. 309-317, vol. 7, No. 5.

K.J. Weber, Transfer of monocrystalline Si films for thin film solar cells, 2004, Austrailian National University.

H. Yamaguchi et al., Investigation of Non-Ohmic Properties for Thin Film InGaP/GaAs Solar Cells, IEEE 4th World Conf on Photovoltaic Energy Conv, May 2006, pp. 1805-1807, vol. 2, IEEE.

Z.M. Zhou et al., The evaluation of Young's modulus and residual stress of nickel films by microbridge testings, Measurement Science and Technology, 2004, pp. 2389-2394, vol. 15, IOP Publishing.

Notification Concerning Transmittal of International Preliminary Report on Patentability dated Dec. 22, 2011; International Application No. PCT/US2010/034161; International Filing Date: May 10, 2010; 1 page.

Notification Concerning Transmittal of International Preliminary Report on Patentability; dated Dec. 22, 2011; International Application No. PCT/US2010/37029; International Filing Date: Jun. 2, 2010; 1 page.

International Preliminary Report on Patentability; Written Opinion of the International Searching Authority; International Application No. PCT/US2010/034161; International Filing Date: May 10, 2010; 8 pages.

International Preliminary Report on Patentability; Written Opinion of the International Searching Authority; International Application No. PCT/US2010/37029; International Filing Date: Jun. 2, 2010; 7 pages.

* cited by examiner

| 401 |
| 301 |
| 204 |
| 203 |
| 202 |
| 201 |

MULTIJUNCTION PHOTOVOLTAIC CELL FABRICATION

CROSS-REFERENCE TO RELATED APPLICATION

This application is a divisional of, and claims priority to, U.S. application Ser. No. 12/713,581 filed Feb. 26, 2010, which is herein incorporated by reference and claims the benefit of U.S. Provisional Application No. 61/185,247, filed Jun. 9, 2009.

FIELD

This disclosure relates generally to the field of multijunction photovoltaic cell fabrication.

DESCRIPTION OF RELATED ART

Multijunction III-V based photovoltaic (PV) cells, or tandem cells, are comprised of multiple p-n junctions, each junction comprising a different bandgap material. A multijunction PV cell is relatively efficient, and may absorb a large portion of the solar spectrum. The multijunction cell may be epitaxially grown, with the larger bandgap junctions on top of the lower bandgap junctions. Conversion efficiencies for commercially available 3-junction III-V based photovoltaic structures may be about 30% to 40%. A III-V substrate based triple junction PV cell may be about 200 microns thick range, a major portion of the thickness being contributed by a bottom layer of a substrate, which may also serve as a junction. The relative thickness of the substrate may cause the substrate layer to be relatively inflexible, rendering the PV cell inflexible.

SUMMARY

In one aspect, a multijunction photovoltaic (PV) cell includes a bottom flexible substrate; a bottom metal layer located on the bottom flexible substrate; a semiconductor layer located on the bottom metal layer; and a stack comprising a plurality of junctions located on the semiconductor layer, each of the plurality of junctions having a respective bandgap, wherein the plurality of junctions are ordered from the junction having the smallest bandgap being located on the substrate to the junction having the largest bandgap being located on top of the stack.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a systems and methods for multijunction PV cell fabrication are provided, with exemplary embodiments being discussed below in detail. Spalling may be used to create a thin semiconductor film for use in fabrication of a flexible PV cell. Spalling allows for the controlled removal of a relatively thin semiconductor layer from a wafer or ingot of a semiconductor substrate using a layer of tensile stressed metal. The thin semiconductor layer may be transferred onto a mechanically flexible support substrate, such as a polymer, or may be left as a free-standing layered-transferred structure. Once the thin semiconductor layer is spalled, the tensile stressed metal used for the spalling process remains on one side of the thin semiconductor layer. The tensile stressed metal may block the illumination of the solar cell. Therefore, a flipping process may be necessary after spalling to achieve an operational PV cell. This is particularly important for III-V multijunction cells, in which the order of the various junctions comprising the cell is crucial for proper cell operation. This spalling may be applied to a single region of a surface of a semiconductor substrate, or to a plurality of localized regions, allowing for selected-area use of the semiconductor substrate. The plurality of localized regions may comprise less than one-hundred percent of the original substrate surface area in some embodiments.

Figure 1:
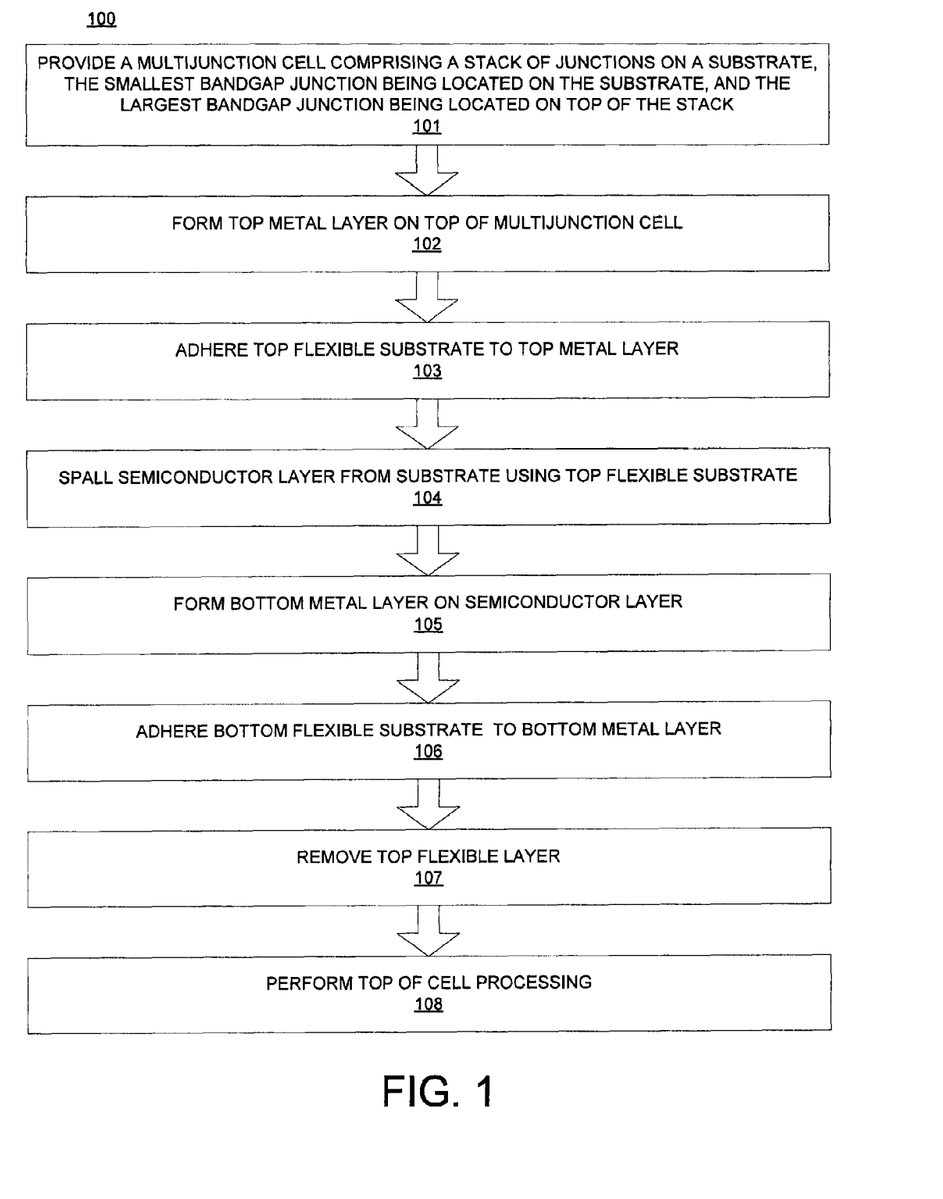
FIG. 1 illustrates an embodiment of a method for fabricating a multijunction PV cell.
Figure 2:
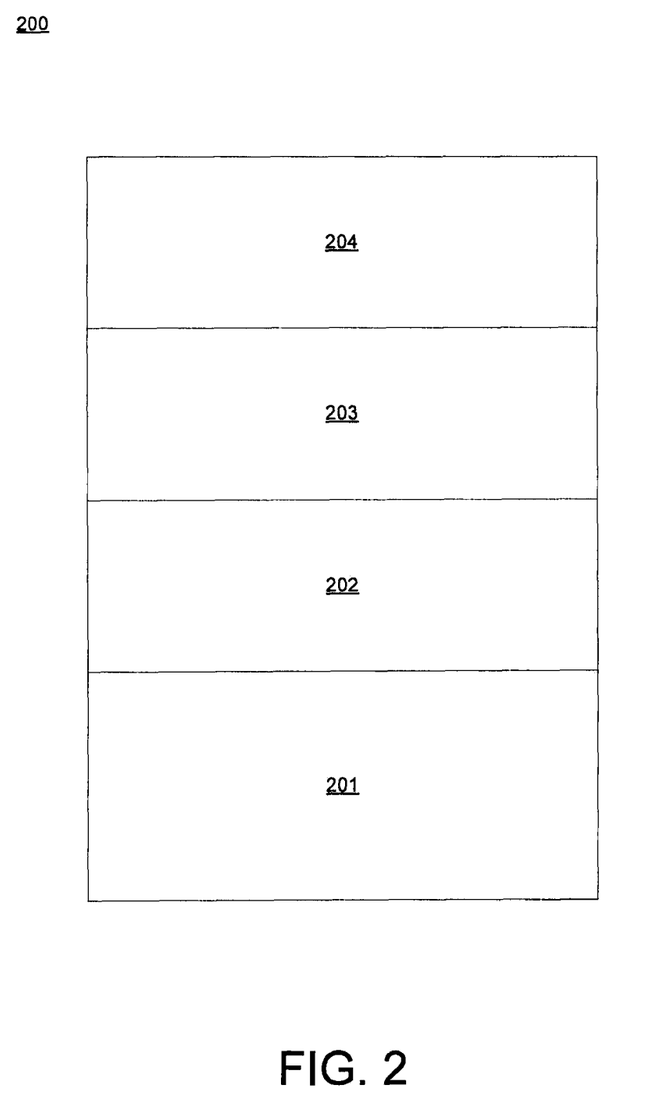
FIG. 2 illustrates an embodiment of a multijunction PV cell on a substrate.

FIG. 1 illustrates an embodiment of a method 100 for fabricating a multijunction PV cell. FIG. 1 is discussed with reference to FIGS. 2-9. In block 101, a multijunction PV cell 200 as shown in FIG. 2 is provided. The multijunction PV cell may be formed by any appropriate growth method, such as molecular beam epitaxy (MBE) or metalorganic vapor phase epitaxy (MOCVD). Junction 202 is formed on substrate 201, junction 203 is formed on junction 202, and junction 204 is then formed on junction 203. Substrate 201 may comprise a III-V substrate, such as gallium arsenide (GaAs), or germanium (Ge) in some embodiments. The bandgap of junction 202 is less than the bandgap of junction 203, and the bandgap of junction 203 is less than the bandgap of junction 204. The largest bandgap p-n junction 204 is grown last, such that that after spalling is performed (discussed below with respect to block 103), junction 204 will be located adjacent to a back metal contact of the multijunction cell. In some embodiments, junction 204 comprises any appropriate relatively large band-gap p/n material, such as a $GaInP_2$-based material; junction 202 comprises any appropriate relatively small bandgap material, such as a GaAs or Ge material; and junction 203 comprises any appropriate material having a bandgap between that of junctions 202 and 204. Junctions 202-204 are shown for illustrative purposes only; cell 200 may be grown with any desired number of junctions, ordered from the junction having the smallest bandgap being located on the substrate 201 to the junction having the largest bandgap located at the top of the stack.

Figure 3:
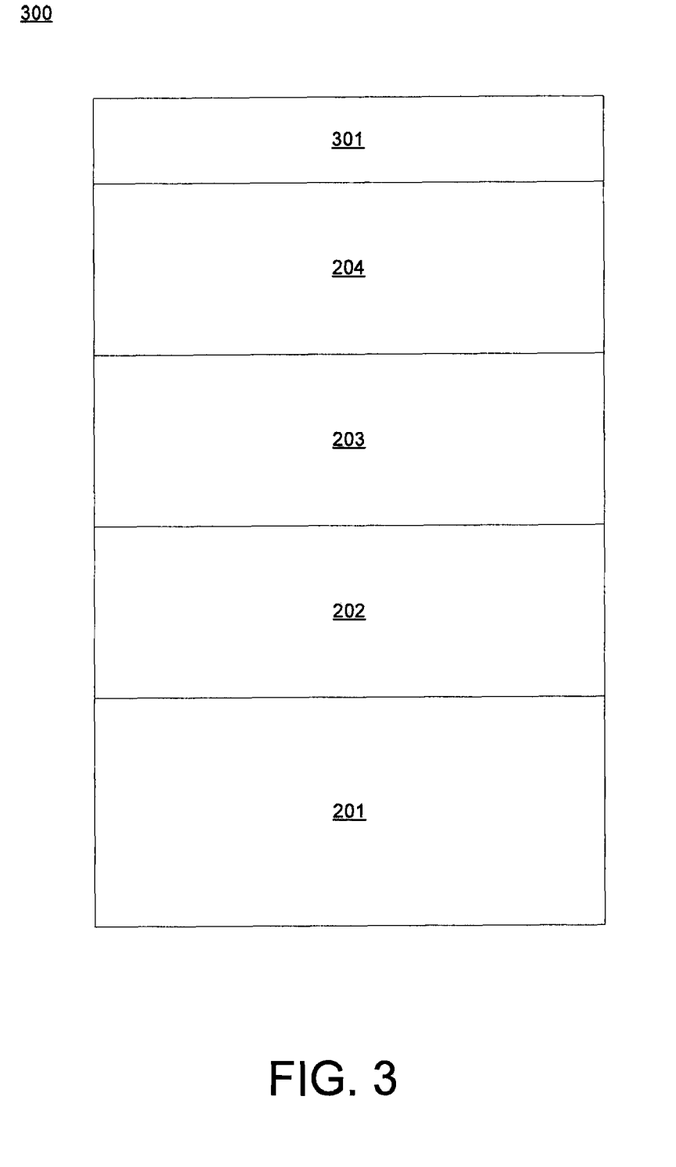
FIG. 3 illustrates an embodiment of a multijunction PV cell after formation of a top metal layer.
Figure 4:
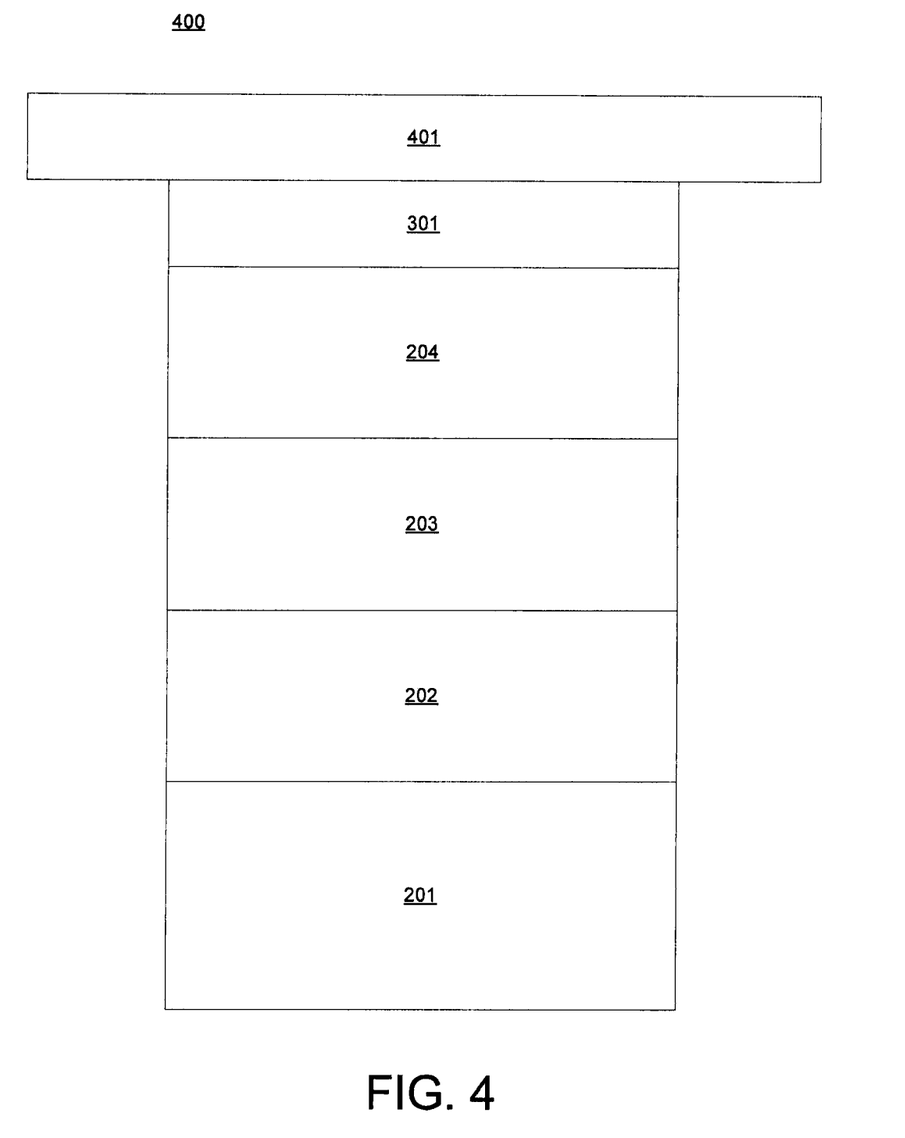
FIG. 4 illustrates an embodiment of a multijunction PV cell after adhering a top flexible substrate to the top metal layer.

In block 102, a top metal layer 301 is formed on junction 204, as is shown in FIG. 3. Top metal layer 301 comprises a tensile stressed metal layer, and may comprise nickel (Ni) in some embodiments. Formation of top metal layer 301 may optionally include formation of a striking layer comprising a metal such as titanium (Ti) on junction 204 before formation of top metal layer 301. The striking layer may act as an adhesion promoter for top metal layer 301. Top metal layer 301 may be about 5-6 microns thick in some embodiments. In block 103, a top flexible substrate 401 is adhered to metal layer 301, as is shown in FIG. 4. Top flexible substrate 401 may comprise polyimide (e.g., Kapton tape) in some embodiments.

Figure 5:
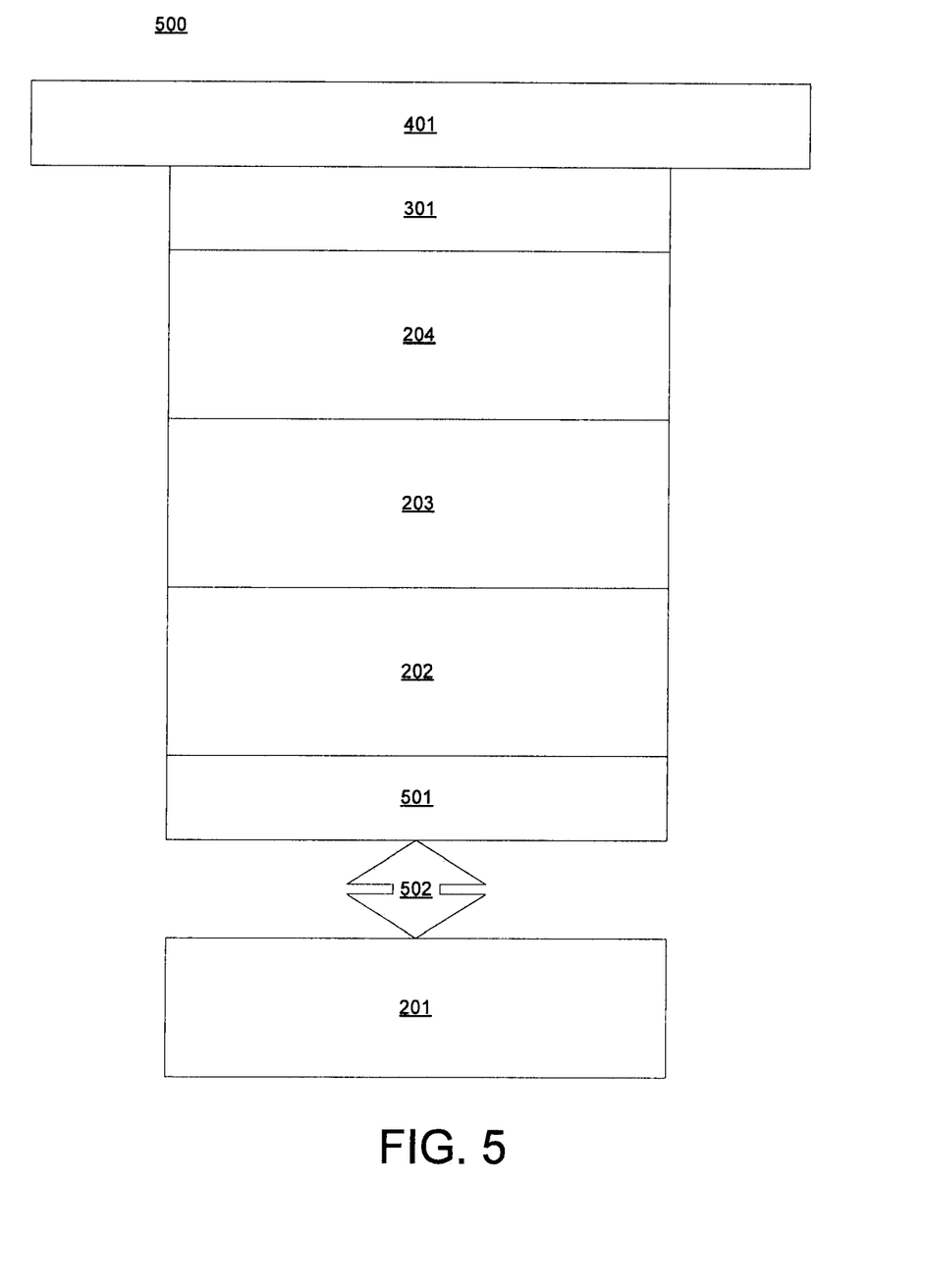
FIG. 5 illustrates an embodiment of a multijunction PV cell after spalling the substrate.

In block 104, semiconductor layer 501 is separated from substrate 201 at fracture 502, as is shown in FIG. 5. Top flexible substrate 401 may serve as a mechanical handle once the spalling of semiconductor layer 501 and junctions 202-204 is initiated. The tensile stress in metal layer 301 encourages formation of fracture 502. Semiconductor layer 501 may be less than about 10 microns thick in some embodiments. In some embodiments, a compressively strained cleave layer may be formed in substrate 201 to weaken the substrate 201 at a pre-determined physical depth or region, allowing precision in the location of fracture 502. The cleave layer may comprise a layer that is preferentially hydrogenated, or may comprise a layer having a lower melting point than substrate 201, such as germanium tin (GeSn) or any material having a stoichiometry that may be preferentially weakened by a physio-chemical means. A temperature gradient (for example, a physical gradient or quenching) or etching may also be used to help induce spalling of semiconductor layer 501 from substrate 201.

Figure 6:
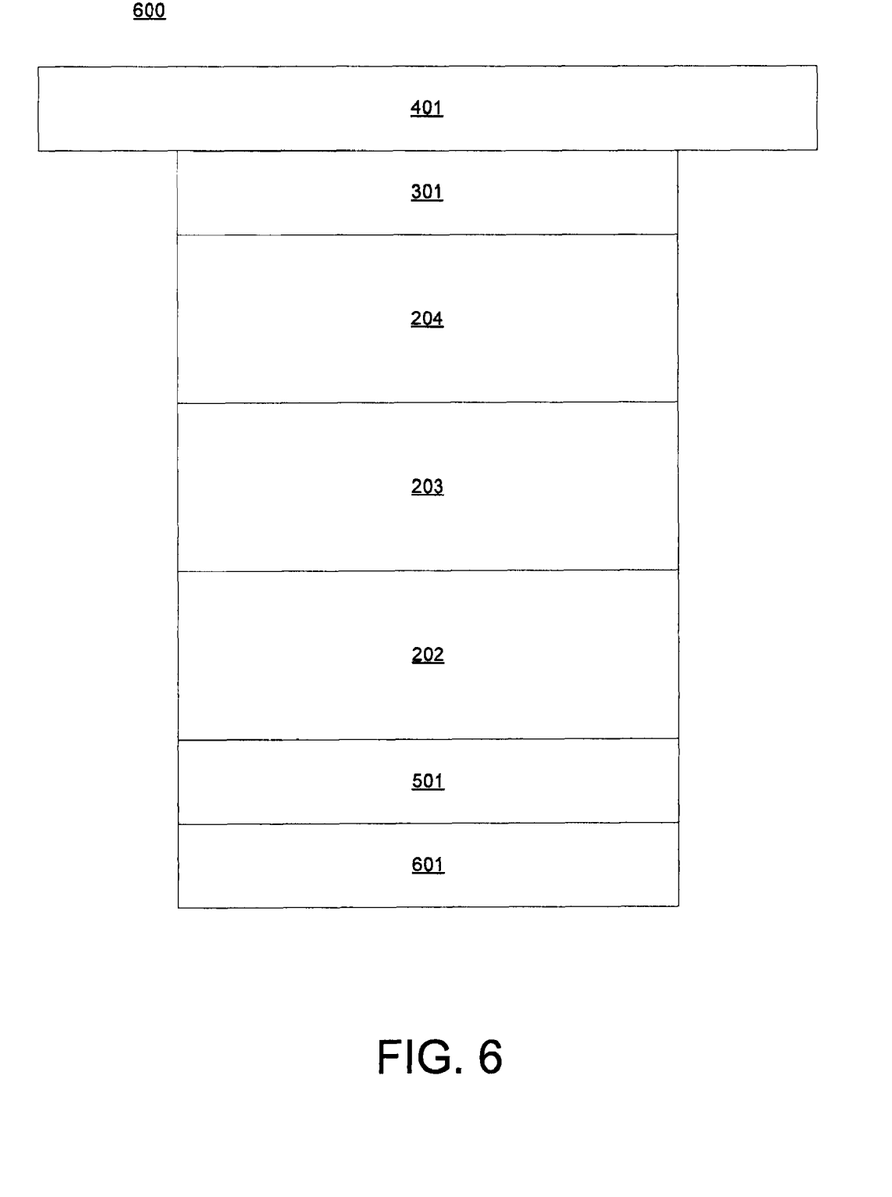
FIG. 6 illustrates an embodiment of a multijunction PV cell after formation of a bottom metal layer.
Figure 7:
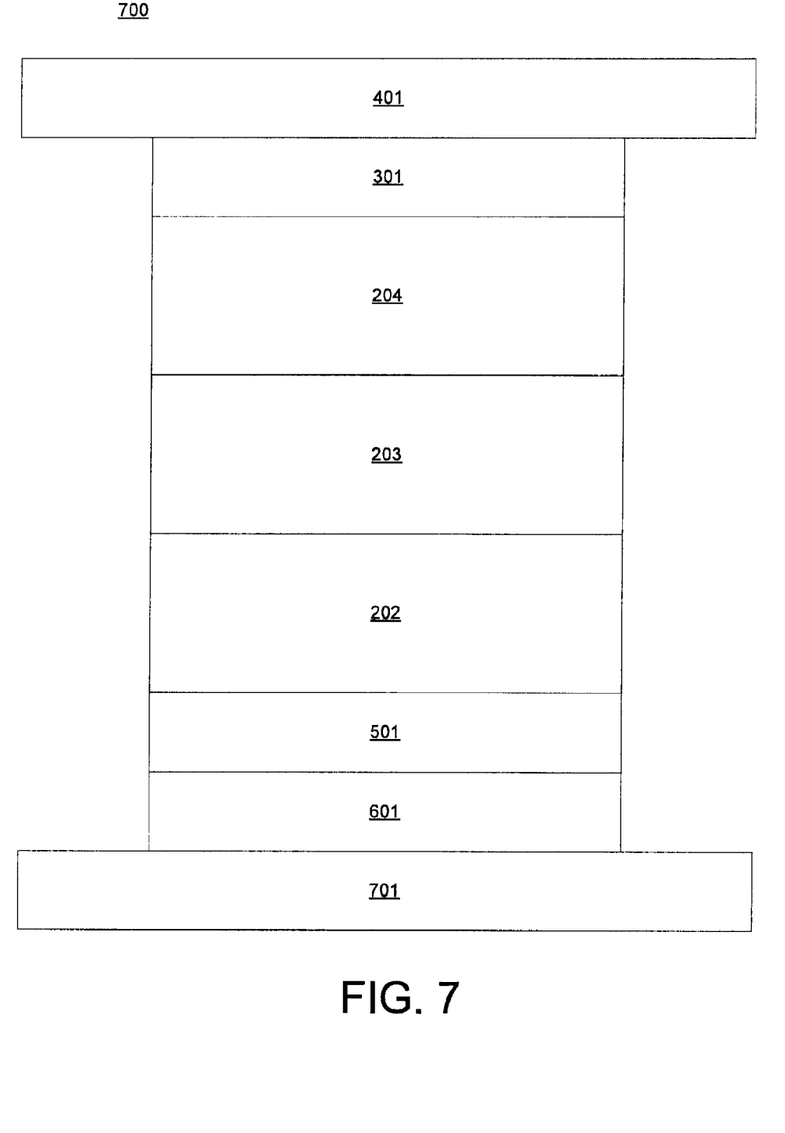
FIG. 7 illustrates an embodiment of a multijunction PV cell after formation of a bottom metal layer.

In block 105, a bottom surface of semiconductor layer 501 may be planarized, and bottom metal layer 601 deposited on semiconductor layer 501, as shown in FIG. 6. Bottom metal layer 601 may comprise a back electrical contact for the multijunction PV cell, and may comprise a metal such as germanium gold (GeAu), Ni, or gold (Au) in some embodiments. Any other necessary back of cell processing may also be performed in block 105, such as back surface field creation, texturing, or patterning. An acid- and temperature-resistant epoxy, wax, or polymer may also be applied to cover the back and protect the sides of the structure 600. In block 106, bottom flexible substrate 701 is adhered to bottom metal layer 601, as shown in FIG. 7. Bottom flexible substrate 701 allows electrical contact to bottom metal layer 601, and may comprise polyimide (e.g., Kapton tape) in some embodiments.

Figure 8:
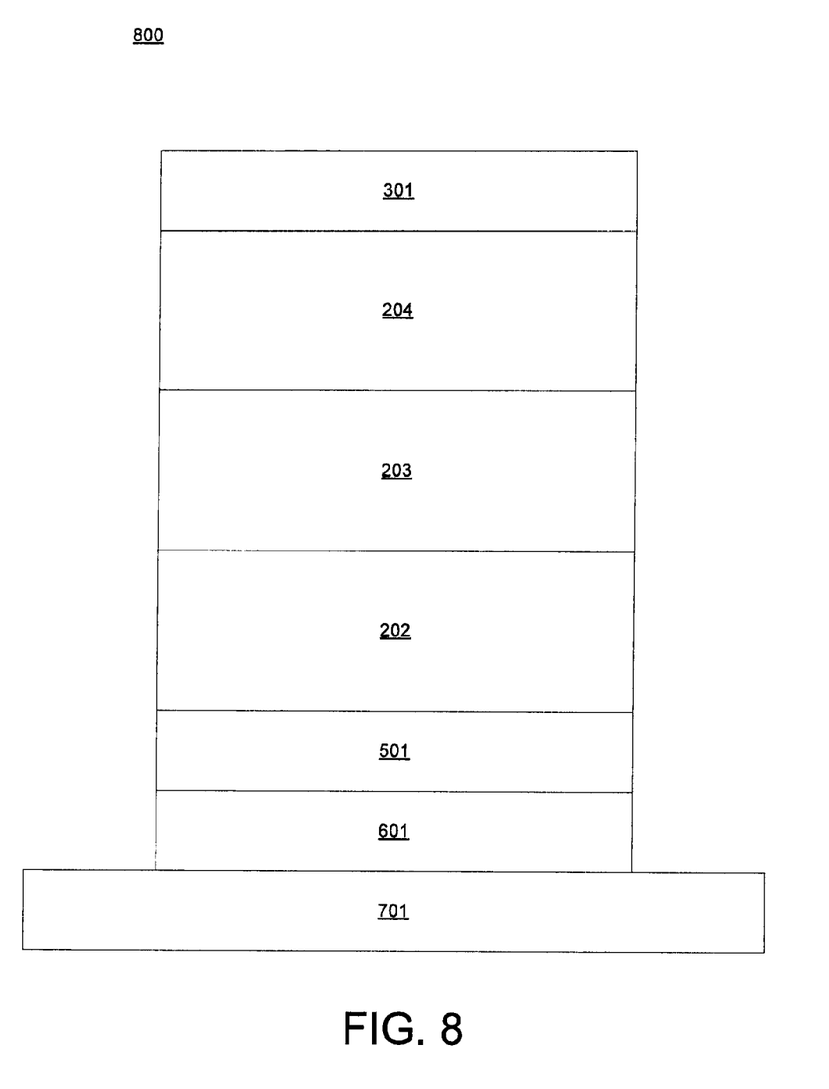
FIG. 8 illustrates an embodiment of a multijunction PV cell after removing the top flexible substrate.

In block 107, top flexible substrate 401 is removed, as is shown in FIG. 8. Removal of top flexible substrate 401 may be performed by placing structure 700 shown in FIG. 7 on a relatively hot surface, or may be detach by a chemical or physical means, which enables the adhesive of top flexible substrate 401 to be weakened and subsequently removed, resulting in structure 800 shown in FIG. 8. The previously applied acid- and temperature-resistant epoxy may protect the structure 700 during removal of top flexible substrate 401.

Figure 9:
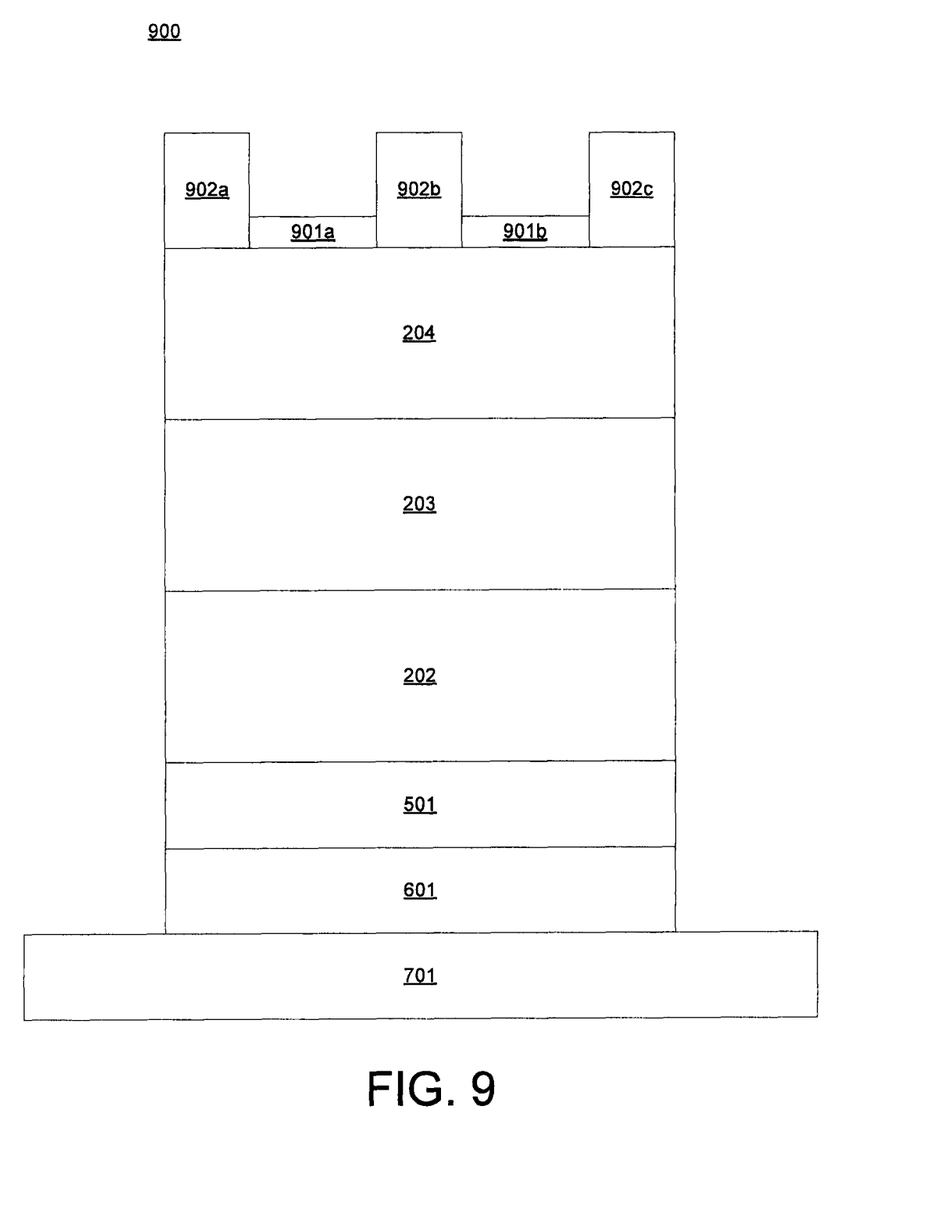
FIG. 9 illustrates an embodiment of a multijunction PV cell after top-of-cell processing.

In block 108, top-of-cell processing is performed to form finished multijunction PV cell 900. Some or all of metal layer 301 may be removed, as shown in FIG. 9. Top metal layer 301 may be removed by any appropriate etching method. In some embodiments, top metal layer 301 may be etched to form metal electrodes 902a-c. In other embodiments, metal electrodes 902a-c may be separately deposited on junction 204 after removal of top metal layer 301. Metal electrodes 902a-c are shown for illustrative purposes only; any appropriate top of cell circuitry may be formed on junction 204 to complete the multijunction PV cell 900. In embodiments comprising a striking layer, the etch of metal layer 301 may be selective to the striking layer material (for example, Ti). Top of cell processing may further comprise formation of an antireflective coating 901a-b on the exposed top surface of junction 204. In embodiments comprising a striking layer, the striking layer may be oxidized to create antireflective coating 901a-b on the surface of junction 204. The antireflective coating 901a-b may provide enhanced light trapping in the multijunction PV cell 900 and enhance cell performance. A total thickness of semiconductor layer 501 and junctions 202-204 may be less than about 15 microns in some embodiments.

Due to the tensile stress in metal layers 301 and 601, the semiconductor layer 501 and junctions 202-204 may possess residual compressive strain after spalling in some embodiments. The magnitude of the strain contained in semiconductor layer 501 and junctions 202-204 may be controlled by varying the thickness and/or stress of the metal layers 301 and 601, either before or after spalling. The optical properties of multijunction PV cell 900, which is built using semiconductor layer 501 and junctions 202-204, may be tuned by adjusting the amount of strain in semiconductor layer 501 and/or junctions 202-204.

The technical effects and benefits of exemplary embodiments include a relatively cost-effective method of fabricating a flexible, efficient multijunction PV cell.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A multijunction photovoltaic (PV) cell, comprising:
   a bottom flexible substrate;
   a bottom metal layer located on the bottom flexible substrate, wherein the bottom metal layer comprises an electrical contact for the multijunction PV cell;
   a stack comprising a plurality of junctions, each of the plurality of junctions having a respective bandgap, wherein the plurality of junctions are ordered from the junction having the smallest bandgap being located on a bottom of the stack to the junction having the largest bandgap being located on top of the stack, and
   a semiconductor layer having a first surface disposed on the bottom metal layer and a second surface opposite the first surface that is disposed on the junction having the smallest bandgap on the bottom of the stack, wherein the semiconductor layer is formed by spalling the semiconductor layer from a substrate at a fracture in the substrate, wherein the fracture is formed in response to the tensile stress of a top metal layer disposed on the junction having the largest bandgap on the top of the stack.

2. The multijunction PV cell of claim 1, further comprising an antireflective coating layer on the junction having the largest bandgap.

3. The multijunction PV cell of claim 1, further comprising at least one electrode formed on the junction having the largest bandgap.

4. The multijunction PV cell of claim 1, wherein the bottom flexible substrate comprises polyimide, and the bottom metal layer comprises one of germanium gold (GeAu), nickel, or gold.

5. The multijunction PV cell of claim 1, wherein the semiconductor layer comprises one of germanium or gallium arsenide, and wherein the semiconductor layer is less than about 10 microns thick.

* * * * *